US008509457B2

(12) United States Patent
Divine et al.

(10) Patent No.: US 8,509,457 B2
(45) Date of Patent: Aug. 13, 2013

(54) TONE BALANCE VOLUME CONTROL

(75) Inventors: Casey Divine, Fairfax, CA (US); John Dahl, San Rafael, CA (US)

(73) Assignee: THX, Ltd., San Francisco, CA (US)

( * ) Notice: Subject to any disclaimer, the term of this patent is extended or adjusted under 35 U.S.C. 154(b) by 1349 days.

(21) Appl. No.: 12/001,534

(22) Filed: Dec. 11, 2007

(65) Prior Publication Data

US 2008/0165987 A1    Jul. 10, 2008

Related U.S. Application Data

(60) Provisional application No. 60/874,453, filed on Dec. 11, 2006.

(51) Int. Cl.
*H03G 3/00*     (2006.01)

(52) U.S. Cl.
USPC .......................................... 381/104; 381/109

(58) Field of Classification Search
USPC ............................. 381/109, 1, 104
See application file for complete search history.

(56) References Cited

U.S. PATENT DOCUMENTS

| 5,625,317 | A | * | 4/1997 | Deveirman | .................... 327/553 |
| 5,798,818 | A | | 8/1998 | Derderian et al. | ............... 352/31 |
| 5,907,622 | A | | 5/1999 | Dougherty | |
| 6,263,354 | B1 | | 7/2001 | Gandhi | |
| 2005/0201572 | A1 | | 9/2005 | Lindahl et al. | ................ 381/103 |
| 2006/0012720 | A1 | * | 1/2006 | Ding | .............................. 348/738 |
| 2006/0088175 | A1 | | 4/2006 | Eid et al. | |
| 2006/0274900 | A1 | | 12/2006 | Griesinger | |
| 2007/0076894 | A1 | * | 4/2007 | Inoue et al. | ..................... 381/27 |
| 2008/0039964 | A1 | * | 2/2008 | Charoenruengkit et al. | ... 700/94 |

FOREIGN PATENT DOCUMENTS

WO     WO2006047600      5/2006

* cited by examiner

*Primary Examiner* — Kimberly Rizkallah
*Assistant Examiner* — Duy T Nguyen
(74) *Attorney, Agent, or Firm* — K. David Crockett, Esq.; Paul J. Backofen, Esq.; Crockett & Crockett, PC

(57)    ABSTRACT

A constant balance volume control according to the present disclosure may provide a user with the ability to listen to program material originally mixed at a known "reference" level at any other suitable level without experiencing a substantial shift in tonal balance. A constant balance volume control may include two 2nd order biquad filters that are controlled in a continuous manner by the volume control of a system. The filters could be implemented in analog or digital form.

3 Claims, 2 Drawing Sheets

TONE BALANCE VOLUME CONTROL

RELATED APPLICATIONS

This application claims priority from U.S. provisional patent application 60/874,453 filed Dec. 11, 2006.

FIELD OF THE INVENTIONS

The inventions described below relate to the field of sound reproduction and presentation, and more specifically to dynamic volume control for reproduction of sound mixed at a reference level.

BACKGROUND OF THE INVENTIONS

Sound reproduction is a balancing act of many characteristics or features of the sound. Conventional sound recordings are mastered at a reference sound level that is rarely reproduced in a users listening environment. Sound reproduced at levels different than the reference level suffers from differences in one or more characteristics such as tonal balance that may degrade the listening experience.

Conventional sound processing devices may include one or more user controls such as a loudness button. This button tends to enable a fixed set of filters that tend to boost bass, or boost bass and treble. Conventional solutions: a) do not vary continuously with the volume control and, b) cannot apply an accurate equal loudness correction since the difference between the current playback level and the reference level is unknown.

SUMMARY

A constant balance volume control is a dynamic volume control that is related to a reference level. The dynamic volume control corrects the reproduced sound characteristics to approach the sound at the reference level.

A constant balance volume control may provide a user with the ability to listen to program material originally mixed at a known "reference" level at any other suitable level without experiencing a substantial shift in tonal balance.

DRAWINGS

DETAILED DESCRIPTION

Figure 1:
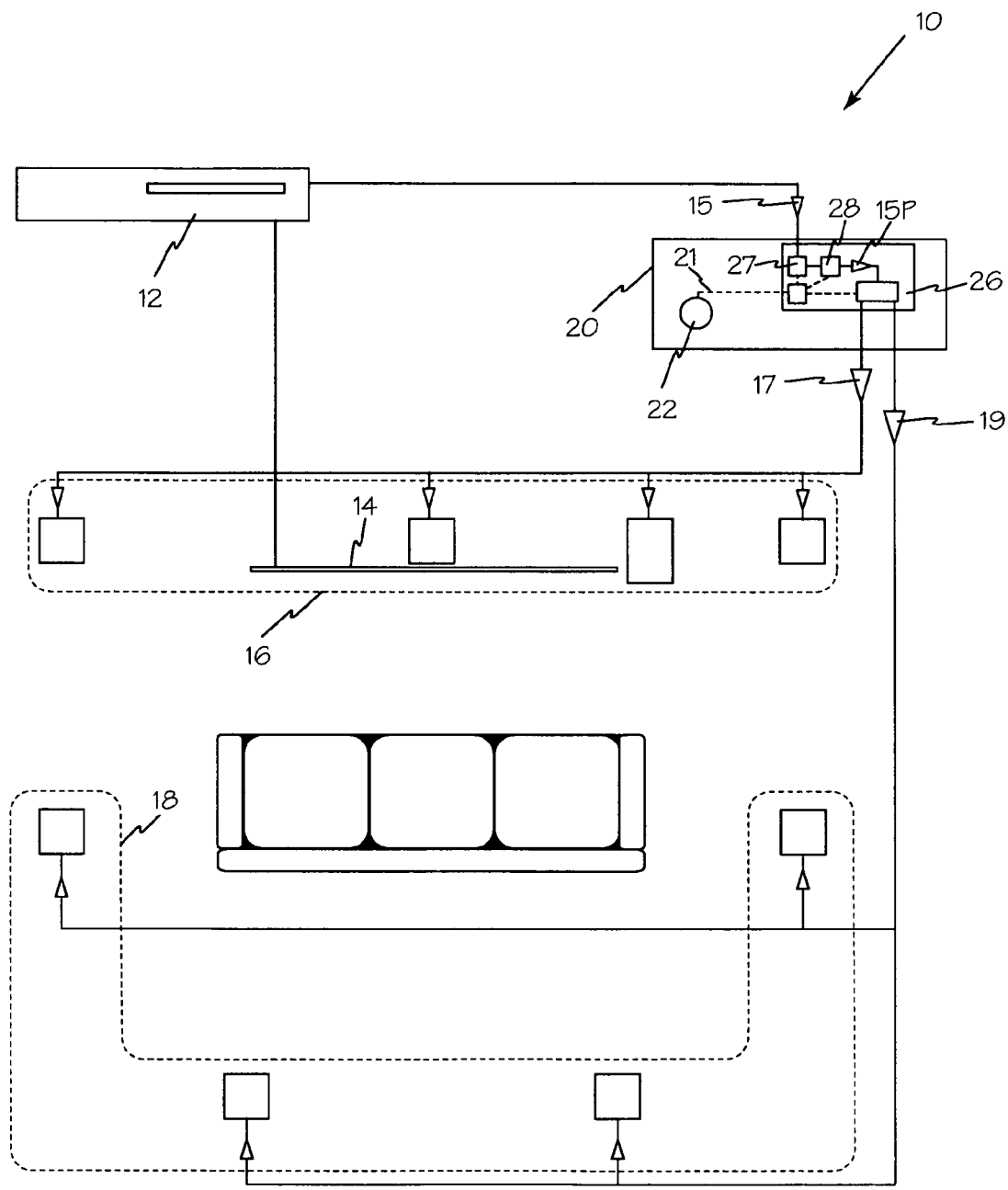
FIG. 1 is a block diagram of a surround sound system incorporating dynamic surround channel volume control.

Surround sound system 10 incorporating sound apparatus 20 with a constant balance volume control is shown in FIG. 1. Surround sound system 10 includes media player 12, display 14, front speakers 16, surround speakers 18 and sound apparatus 20. Sound apparatus 20 may be any suitable sound processing apparatus such as a sound receiver. Volume control 22 is primary volume control for sound apparatus 20. Sound signal 15 is provided from media player 12. Sound signal 15 is processed in processor 26 according to primary volume setting 21 and any other suitable parameters. Sound processor may include one or more signal processing elements such as filters, and also separates primary channel signals 17 from surround signals 19.

A constant balance volume control may include two $2^{nd}$ order biquad filters such as filters 27 and 28 that are controlled in a continuous manner by the volume control 22 of the system. The filters 27 and 28 may be implemented suitably in analog or digital form.

The shape of the output signal 15P from constant balance filters 27 and 28 is such that the filters approximately correct for the difference between the loudness of tones or noise from the reference level to the current volume level. The range of the constant balance filter correction may be within the region 20 Hz to 12.5 kHz or any other suitable range. Constant balance filters 27 and 28 control values, or the z-plane values of the digital filters, could be stored in a lookup table or could be calculated automatically from the current volume position 21.

The reference level is the level at which the program material, specifically sound signal 15, was originally mixed. In the present constant balance control system, the midrange setting of the master volume control is selected to correspond to the reference level.

For example, a suitable control algorithm may use Fcenter, Fstep, Q, Gstep and Vol as control variables. The filter's parameters (F1, Q1, F2, Q2 and G) are:

F1=Fcenter+(Fstep*Vol)
F2=Fcenter−(Fstep*Vol)
Q1=Q
Q2=Q
G=Gstep*Vol
Vol=the absolute value of the volume control Filter 27 is a low frequency boost shelf, and filter 28 is a high frequency boost shelf. Parameter values for the first filter are: Fcenter=169.33 Hz, Fstep=2.687 Hz, Q=0.373, Gstep=−0.0253. Parameter values for the second filter are: Fcenter=9604.2 Hz, Fstep=53.38 Hz, Q=0.7, Gstep=0.

Figure 2:
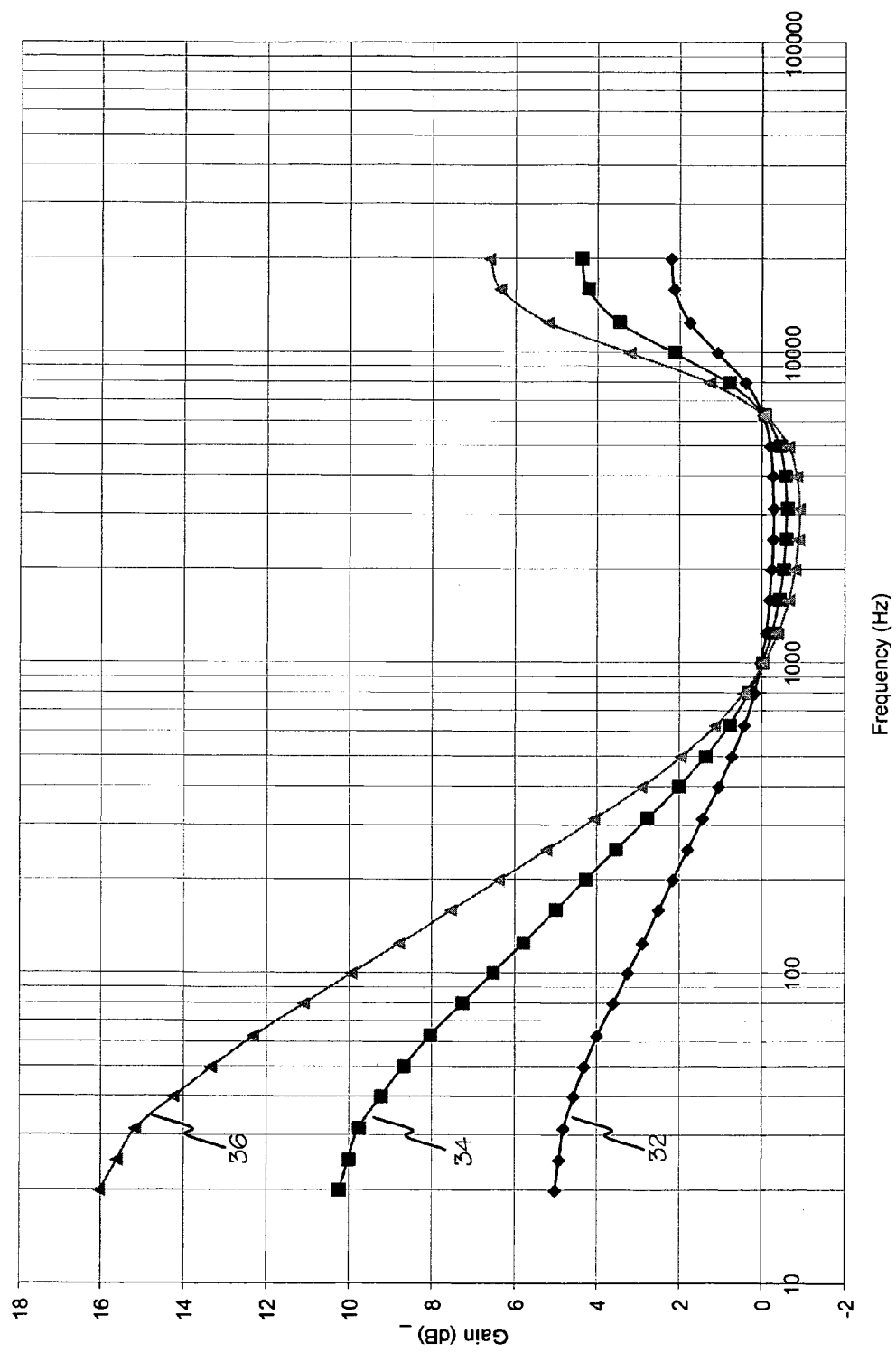
FIG. 2 is a graph of a constant balance volume control filter response.

Referring now to FIG. 2, curve 32 represents the response of a suitable sound system at −10 db compensation. Curve 34 represents the response of a suitable sound system at −20 db compensation. Curve 36 represents the response of a suitable sound system at −30 db compensation.

While the preferred embodiments of the devices and methods have been described in reference to the environment in which they were developed, they are merely illustrative of the principles of the inventions. Other embodiments and configurations may be devised without departing from the spirit of the inventions and the scope of the appended claims.

We claim:

1. A sound system for a sound content playback comprising:
    means for providing a content sound signal that was mixed and recorded at a reference sound pressure level;
    a digital sound receiver for processing the content sound signal, the sound receiver having a sound processing microprocessor and a master volume control with the sound processing of the microprocessor related to the reference sound pressure level and the master volume control, the sound receiver including;
        a low frequency boost shelf digital sound filter processing the content sound signal as a continuous function of the master volume control and the reference sound pressure level;
        a high frequency boost shelf digital sound filter processing the content sound signal as a continuous function of the master volume control and the reference sound pressure level.

2. A sound system for a sound content playback comprising:
    a digital sound receiver having a one or more sound input ports for receiving a sound content which was mixed and recorded at a reference sound pressure level and one or more sound output ports, a master volume control, a sound processing microprocessor, a first $2^{nd}$ order biquad sound filter and a second $2^{nd}$ order biquad sound filter, the combined first and second $2^{nd}$ order biquad sound filters operating together as a continuous function of the master volume control and the reference sound pressure level to process the sound content; and a plurality of speakers connected to the sound output ports for presentation of the processed sound content.

3. The sound system of claim 2 wherein the first $2^{nd}$ order biquad filter is a low frequency boost shelf digital sound filter processing the sound content as a continuous function of the master volume control system and the reference sound pressure level, and the second $2^{nd}$ order biquad filter is a high frequency boost shelf digital sound filter processing sound as a continuous function of the master volume control and the reference sound pressure level.

\* \* \* \* \*